(12) United States Patent
Leija et al.

(10) Patent No.: US 7,420,804 B2
(45) Date of Patent: Sep. 2, 2008

(54) LIQUID COOLING SYSTEM INCLUDING HOT-SWAPPABLE COMPONENTS

(75) Inventors: Javier Leija, Chandler, AZ (US); Christopher D. Lucero, Phoenix, AZ (US); Christopher A. Gonzales, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 423 days.

(21) Appl. No.: 10/881,884

(22) Filed: Jun. 30, 2004

(65) Prior Publication Data

US 2006/0002080 A1    Jan. 5, 2006

(51) Int. Cl.
*H05K 7/20* (2006.01)
(52) U.S. Cl. .................. 361/687; 361/699; 165/80.4
(58) Field of Classification Search .......... 361/687, 361/699; 165/80.4
See application file for complete search history.

(56) References Cited

U.S. PATENT DOCUMENTS

| | | | | |
|---|---|---|---|---|
| 3,917,370 | A * | 11/1975 | Thornton et al. | 439/194 |
| 6,580,609 | B2 * | 6/2003 | Pautsch | 361/698 |
| 6,587,343 | B2 * | 7/2003 | Novotny et al. | 361/698 |
| 6,754,076 | B2 * | 6/2004 | Cox et al. | 361/699 |
| 6,882,533 | B2 * | 4/2005 | Bash et al. | 361/696 |
| 6,935,868 | B1 * | 8/2005 | Campini et al. | 439/67 |
| 7,011,143 | B2 * | 3/2006 | Corrado et al. | 165/80.4 |
| 7,097,495 | B2 * | 8/2006 | Sweetland | 439/495 |
| 7,184,267 | B2 * | 2/2007 | Patel | 361/692 |
| 2002/0127900 | A1 | 9/2002 | Goodwin et al. | |
| 2004/0008483 | A1 * | 1/2004 | Cheon | 361/687 |
| 2004/0057211 | A1 | 3/2004 | Kondo et al. | |
| 2005/0083657 | A1 * | 4/2005 | Hamman | 361/699 |
| 2005/0180105 | A1 * | 8/2005 | Matsushima et al. | 361/699 |
| 2005/0241803 | A1 * | 11/2005 | Malone et al. | 165/80.4 |
| 2005/0244280 | A1 * | 11/2005 | Malone et al. | 417/286 |

FOREIGN PATENT DOCUMENTS

DE             2651015        5/1978
WO  PCT/US2005/022978        12/2005

\* cited by examiner

*Primary Examiner*—Jayprakash N Gandhi
*Assistant Examiner*—Ingrid Wright
(74) *Attorney, Agent, or Firm*—Blakely, Sokoloff, Taylor & Zafman LLP

(57) ABSTRACT

The specification discloses an apparatus comprising a cold plate having an inlet and an outlet, the cold plate being attachable to a heat source, a heat exchanger having an inlet and an outlet, wherein the outlet of the heat exchanger is coupled to the inlet of the cold plate, and a hot-swappable pump module including at least one pump, the pump module being coupled to the cold plate and to the heat exchanger. The specification also discloses a process comprising cooling a heat source using a closed-loop cooling system comprising a cold plate having an inlet and an outlet, the cold plate being attachable to the heat source, a heat exchanger having an inlet and an outlet, wherein the outlet of the heat exchanger is coupled to the inlet of the cold plate, and a hot-swappable pump module including at least one pump, the pump module being coupled to the cold plate and to the heat exchanger, and removing or installing the pump module while the cooling system is operating. Other embodiments are described and claimed.

29 Claims, 5 Drawing Sheets

LIQUID COOLING SYSTEM INCLUDING HOT-SWAPPABLE COMPONENTS

TECHNICAL FIELD

The present invention relates generally to liquid cooling systems and in particular, but not exclusively, to liquid cooling systems including hot-swappable components.

BACKGROUND

Most electronic devices such as servers, computers and the like, are made up of various electronic components within some sort of metal box or chassis. In particular, many servers now fit on individual circuit boards known as "blades" and are placed within a chassis conforming to the Advanced Telecom Computing Architecture (ATCA) 3.0 standard, published January 2003. The ATCA standard defines an open switch fabric-based platform delivering an industry standard high performance, fault tolerant, and scalable solution for next generation telecommunications and data center equipment. The development of the ATCA standard is overseen by the PCI Industrial Computer Manufacturers Group (PICMG)—the same group that created the highly successful Compact PCI standard.

The ATCA 3.0 base specification defines the physical and electrical characteristics of an off-the-shelf, modular chassis based on switch fabric connections between hot-swappable blades. Specifically, the ATCA 3.0 base specification defines the frame (rack) and shelf (chassis) form factors, core backplane fabric connectivity, power, cooling, management interfaces, and the electromechanical specification of the ATCA-compliant boards. The ATCA 3.0 base specification also defines a power budget of 200 Watts (W) per blade, enabling high performance servers with multi-processor architectures and multi gigabytes of on-board memory.

During operation, each blade's components generate heat. Existing form factors for blade-type computers rely on forced convection for cooling. In blade computers conforming to the ATCA 3.0 specification, large solid metal heatsinks are used together with forced convection to cool high-power processors. The volume of the heatsinks, however, is limited due to height restrictions and, based on current chassis technologies, the volumetric airflow rate is also limited. As such the cooling capacity of the heatsink is extremely limited, thus limiting the usage of higher performance (and higher heat generating) processors. In addition, to extend the cooling capacity the processors must be placed at the location of the coolest air temperature, so heat generating devices are confined to being placed at the lower part of the blade so cool air flowing into the chassis will immediately flow over the heatsinks.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of a liquid cooling system having hot-swappable components are described herein. In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1:
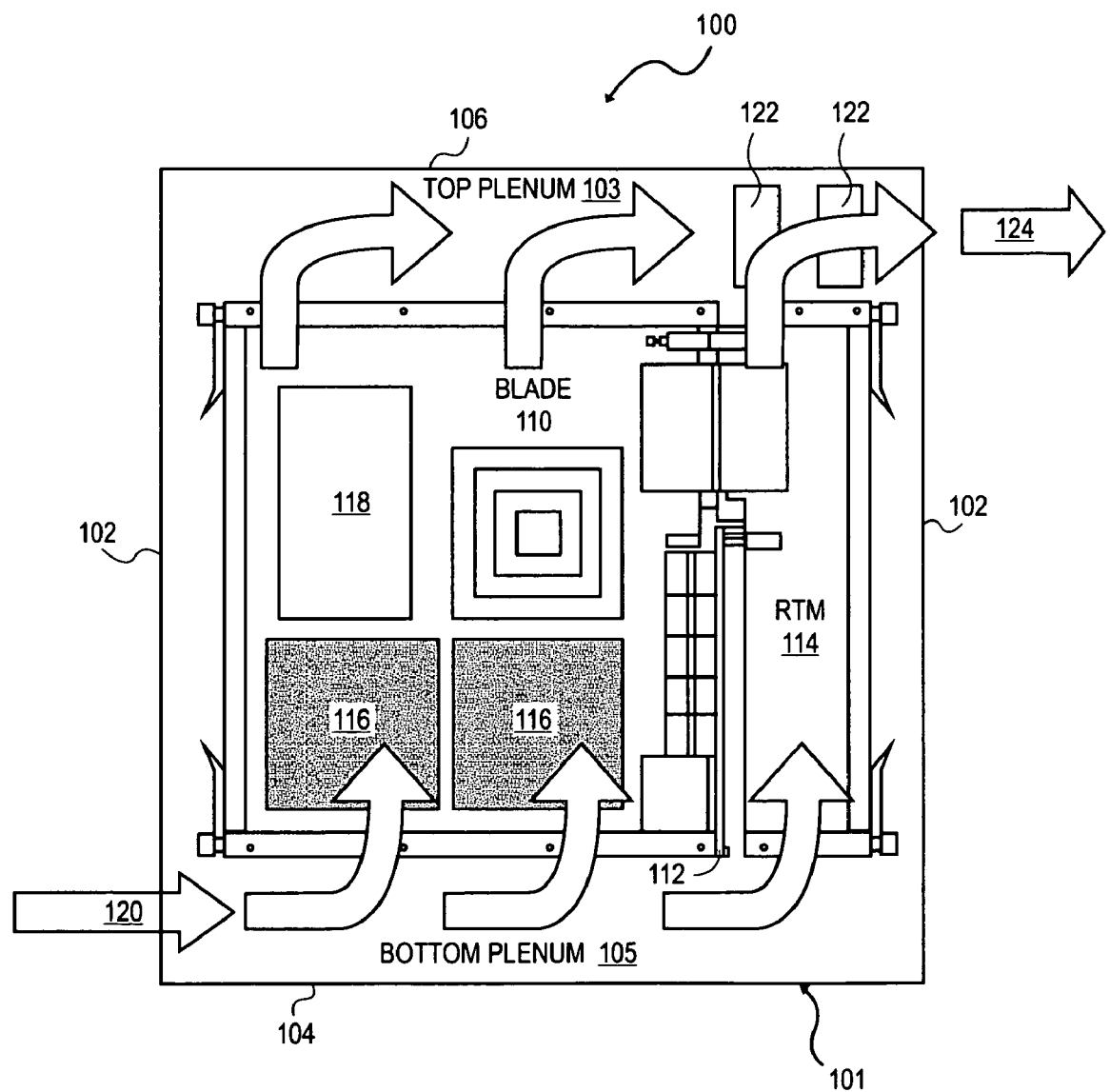
FIG. 1 is a side view of an embodiment of a server conforming to the Advanced Telecom Compute Architecture (ATCA) specification.

FIG. 1 illustrates an embodiment of a server 100. Although the server 100 is referred to in the singular, it can actually include many separate servers, each on its own blade. The server 100 includes a chassis 101 within which are found the electronic components that make up the server. In the illustrated embodiment, the chassis 101 is a chassis conforming to the ATCA form factor specification and is a metal box made up of a top 106, a bottom 104 and four sidewalls 102. Within the chassis 101, a bottom plenum 105 is located below the components, while a top plenum 103 is located above the components. At least two of the sidewalls 102 include air vents that allow cool air into the bottom plenum 105, while an outlet at the rear of chassis allows warm air 124 to exit the top plenum.

The electronic components inside the chassis include one or more individual servers, each on a separate blade 110. Each blade 110 includes, among other things, a pair of processors 116 and a memory 118, which can be a volatile memory such as dynamic random access memory (DRAM) or synchronous dynamic random access memory (SDRAM), or can be a non-volatile memory such as flash read-only memory (ROM) or disk storage. In one embodiment, the processors 116 can have heat sinks attached thereto to improve heat transfer. The blades 110 plug into a backplane 112, which functions as a sort of motherboard that connects the different blades together and manages communication between individual blades and exterior devices, as well as among the blades themselves. The optional RTM 114 provides optional additional connections and functionality separate from the backplane. The backplane 112, blades 110 and RTM 114 are vertically oriented in the chassis.

In operation, the components on each blade 110, such as processors 116, generate substantial heat. The blades 110 are cooled by air flowing through the chassis 101 by forced convection. Cool air 120 enters the bottom plenum 105 and moves upward so that it flows over the components on blades 110, such as the processors 116 and their associated heatsinks. Forced convection units, in this case a pair of fans 122, are located at or near the outlet at the rear of the top plenum 103. The fans both draw cool air 120 into the chassis and expel hot air 124 from the chassis, increasing the flow of air through the chassis and the overall amount of heat removed from the chassis.

Figure 2:
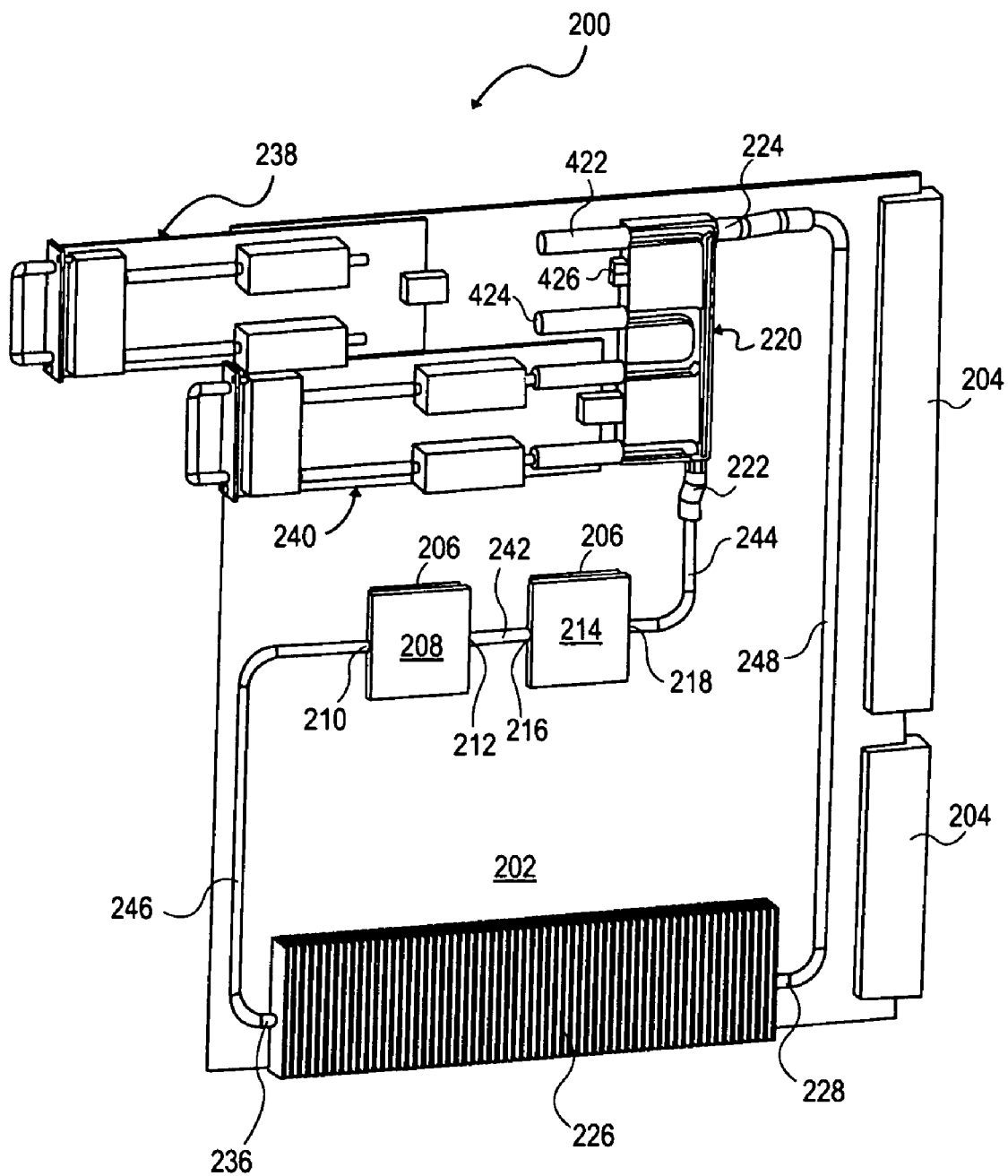
FIG. 2 is an isometric view of an embodiment of the invention adapted for use in a blade-type computer.

FIG. 2 illustrates an embodiment of the invention comprising a blade computer including a cooling system 200. The blade 202 includes connectors 204 that allow the blade computer 200 to be plugged into a backplane in a chassis. In one embodiment, the blade conforms to the PICMG Advanced Telecommunication Architecture (ATCA) 3.0 base standard, although in other embodiments the blade 202 need not conform to the ATCA standard.

The cooling system 200 includes four basic components: cold plates 208 and 214, each mounted to a processor 206; a leak-free connector 220 mounted to the blade; two pump modules 238 and 240; and a heat exchanger 226 mounted to the blade 202. The cold plate 208 has an inlet 210 and an outlet 212, and the cold plate 214 has an inlet 216 and an outlet 218. The cold plates are connected in series, with the outlet 212 of cold plate 208 coupled to the inlet 216 of the cold plate 214 by tubing 242. The outlet 218 of the cold plate 214 is coupled to the inlet 222 of the leak-free connector 220 by tubing 244, while the outlet 224 of the leak-free connector is coupled to the inlet 228 of the heat exchanger 226 by tubing 248. The outlet 230 of the heat exchanger is coupled to the inlet 210 of the cold plate 208. To completely close the cooling loop, pump modules 238 and 240 are plugged into the leak-free connector 220.

The cold plates 208 and 214 are each mounted to a processor 206. Each cold plate 205 is an optimized metal plate with an internal structure designed to allow the fluid to flow through. The internal structure is usually optimized to produce the greatest heat transfer at the lowest flow rate. Heat is removed from the heat-generating device (e.g., the processors 206) through the cold plates and transferred to the working fluid. The working fluid is then pumped out of the cold plates to the heat exchanger 226, where the heat is then transferred by convection to the air flowing over the blade 202.

The heat exchanger 226 transfers the heat from the working fluid to the system airflow. In the illustrated embodiment, the heat exchanger is a fluid-air heat exchanger. Fluid-air heat exchangers include one or more tubes through which a hot working fluid flows. The tubes are attached to several cooling fins, over which air moves. Heat from the fluid is transferred by conduction from the fluid to the fins, and then by convection from the fins to the air flowing past the fins. In other embodiments of the cooling system 200, however, other types of heat exchangers can be used.

The tubing used to connect the various components of the system 200 and transport fluid among the components can be any kind of tubing. In one embodiment, flexible non-metallic tubing is used for ease of installation and to prevent short-circuiting if the tubing should come into contact with electrical components on the blade 202. In other embodiments, however, stiff metal or non-metal tubing can be use as well.

The leak-free connector 220 is mounted to the surface of the blade 202 and distributes the cooling fluid to any number of pump modules mounted to mezzanine cards. Mezzanine cards are cards that plug into a blade rather than into a backplane, such as an Advanced Mezzanine Card form factor. The leak-free connector 220 is designed as a leak-free, quick disconnect system that enables the mezzanine card pump modules to be removed with ease while the system 200 is operating without disrupting the system; in other words, the connector 220 makes the pump modules hot-swappable. In addition, the connector 220 includes electrical leads to provide power from the blade 202 to the mezzanine cards. Further details of the leak-free connector 220 are discussed below in connection with FIGS. 4 and 5A-5B.

The pump modules 238 and 240 drive the working fluid through the cold plates, the tubing, and the heat exchanger. Multiple pump modules can be used in series as shown to increase fluid pumping capacity, add redundancy, and improve system reliability. In the illustrated embodiment there are two pump modules, but in other embodiments more or less pump modules can be used. For example, under the current ATCA 3.0 standard, a blade can accommodate up to four mezzanine cards. Non-ATCA blades, however, may be able to accommodate more mezzanine cards.

Both pump modules 238 and 240 include pumps and reservoirs placed on mezzanine cards. These particular components are put on mezzanine cards because they are the components that typically have the lowest mean time between failures (MTBF)—that is, they are the components most likely to require maintenance or replacement. The pump modules also includes leak-free quick-disconnect disconnect fluid and electrical connectors to interface with the leak-free connector 220. When a pump module is removed the connector 220 acts like a valve and closes the fluid path, preventing leakage from the removed pump module. The internal geometry of the fluid/electrical connector is designed so that fluid will still flow to the remaining pump module. This allows one pump module to be removed for maintenance while still providing adequate cooling to the blade so that it remains functional. Further details of the pump modules 238 and 240 are discussed below in connection with FIG. 3.

Figure 3:
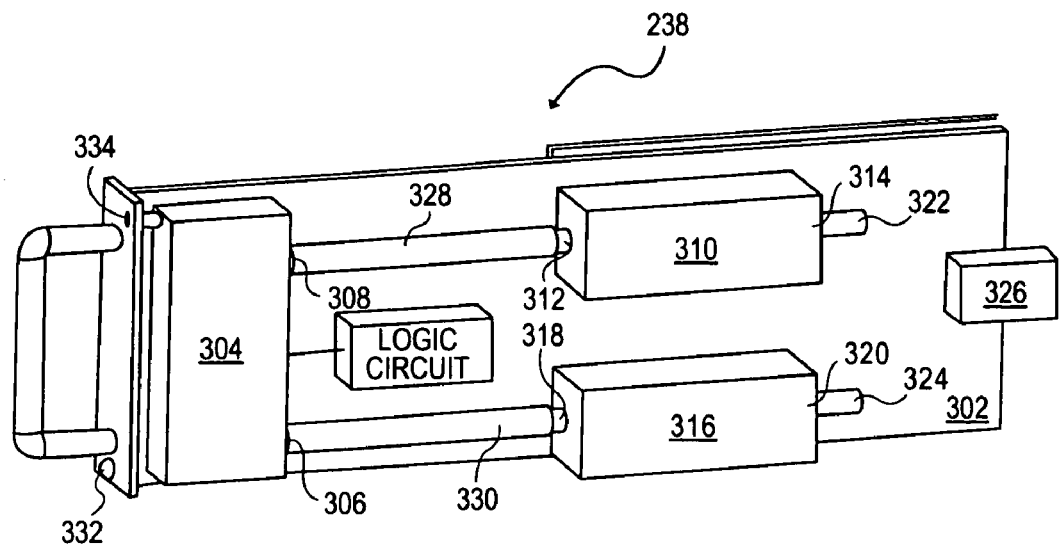
FIG. 3 is an isometric view of an embodiment of a hot-swappable pump module usable with an embodiment of the invention as shown in FIG. 2.

FIG. 3 illustrates a detailed view of an embodiment of the pump module 238. The pump module 238 includes a fluid reservoir 304, a pair of pumps 310 and 316 and an electrical connector 326. All these components are mounted on mezzanine card 302. To allow for easy removal for service, the mezzanine card includes components that have the lowest mean time between failures (MTBF) and require frequent maintenance. The mezzanine card also includes features to ease the removal of the card from the blade 202, for example a handle.

In the pump module 238, the fluid reservoir 304 has an inlet 306 and an outlet 308. The pump 316 has an inlet 320 with a quick connect/disconnect fitting 324 attached thereto and an outlet 318 coupled to the inlet 306 of the reservoir by tubing 330. Similarly, the pump 310 has an inlet 312 coupled to the outlet 308 of the reservoir by tubing 328, and has an outlet 314 with a quick connect/disconnect fitting 322 attached thereto.

The fluid reservoir 304 is attached to the mezzanine card 302 and can be of any shape and size, so long as it holds the required volume of working fluid and meets other constraints. In one embodiment, the working fluid is water at atmospheric pressure, but in other embodiments different fluids or mixtures of fluids at different pressures can be used. For instance, a 50% mix of ethylene glycol and water at atmospheric pressure can be used. In other embodiments, the working fluid can be multi-phased, meaning that it can exist in the system in both liquid and gas states, for example. Pressures different than atmospheric can also be used.

In the illustrated embodiment, the reservoir 304 is a thin rectangular box whose dimensions are consistent with the ATCA 3.0 standard for mezzanine cards, although in other embodiments the reservoir can have a different shape and size. The fluid reservoir 304 can include a fluid level sensor such as a float valve (not shown) to measure the amount of fluid in the reservoir. The fluid level sensor can be coupled to logic circuitry also mounted on the mezzanine card 302, and the logic circuitry connected to some external indicator of the fluid level. In the illustrated embodiment, the external indicator is a light emitting diode (LED) 332 on the faceplate of the mezzanine card that lights up when the fluid level is lower than required. In other embodiments, however, the external indicator can be something different such as a gauge that indicates the actual level of fluid in the reservoir, whether too low or not. When the fluid level in the reservoir is low, the fluid can be replenished without removing the mezzanine card using a fluid refill port 334 connected to the reservoir and the faceplate.

In the embodiment shown, there are two pumps 310 and 316 connected in series on the mezzanine card 302. The pumps 310 and 316 can be any kind of electronic pump that meets the size and flow requirements of the system. In one embodiment, the pumps 310 and 316 are voltage-driven in-line piston pumps. In other embodiments, however, other types of pump can be used. For example, commercially available pumps such as those commonly used in aquariums can also be used. Any number of pumps can be placed on the mezzanine card to allow for redundancy and improved fluid flow. The illustrated embodiment has two pumps 310 and 316, but other embodiments can have more than two pumps or only a single pump, provided the single pump is reliable enough (i.e., has a high enough mean time between failures (MBTF). The pump 310 has a quick connect/disconnect fitting 322 attached to its outlet and the pump 316 has a quick connect/disconnect fitting 324 attached to its inlet. When the pump module 238 is installed on the blade 202, the fittings 322 and 324 engage with quick connect/disconnect fittings 422 and 424 on the leak-free connector 220 (see FIG. 4).

The mezzanine card 302 also includes an electrical connector 326 to interface with the electrical connector on the leak-free connector. When coupled with the corresponding electrical connector 426 on the leak-free connector 220 (see FIG. 4, the electrical connector 326 provides the electrical power necessary to run the pumps 310 and 316, the logic circuitry that is coupled to the LED 332 and to the fluid level sensor inside the reservoir, and any other devices on the mezzanine card requiring electrical power. The electrical connector 326 also provides a data connection between the blade 202 and the mezzanine card.

Figure 4:
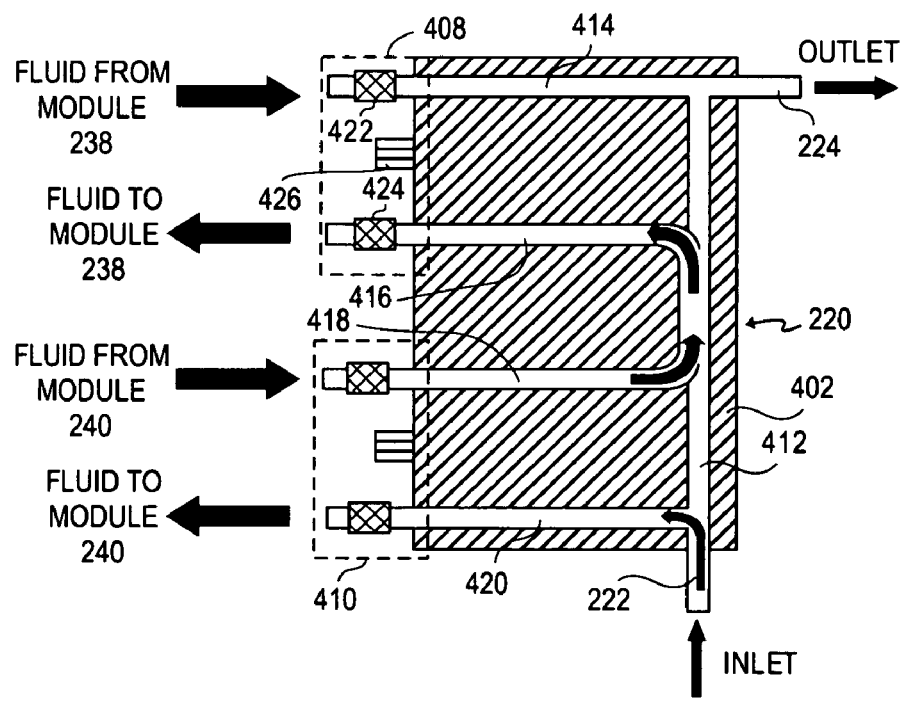
FIG. 4 is a cross-section of an embodiment of a fluid and electrical connector usable with an embodiment of the invention as shown in FIG. 2.

FIG. 4 illustrates details of an embodiment of the leak-free connector 220. The connector 220 is designed to accommodate two pump modules, but can easily be modified to accommodate more or less modules. The leak-free connector 220 includes a housing 402 within which there is a balancing channel 412 connected to four tubes that supply fluid to the pump modules: tube 416 supplies fluid to pump module 238 and tube 414 receives fluid from that pump module, while tube 420 supplies fluid to pump module 240 and tube 418 receives fluid from that pump module. The main inlet 222 is coupled to the cold plates via tube 244 and supplies fluid to the connector 220, while the main outlet 224 is coupled to the heat exchanger 226 via tube 248 and carries fluid away from the connector 220.

The connector 220 also includes two pump interfaces 408 and 410, one for each pump module. Pump interface 408 includes the end of tube 414 with a quick connect/disconnect fitting 422 thereon, the end of tube 416 with a quick connect/disconnect fitting 424 thereon, and an electrical connector 426. Pump interface 410 has similar components. When pump module 238 is in its installed position, the fitting 322 from the outlet of pump 310 is engaged by the quick connect/disconnect fitting 422, the fitting 324 from the inlet of pump 316 is engaged by the quick connect/disconnect fitting 424, and the electrical connector 426 is engaged by the electrical connector 326 on the mezzanine card 302. The use of quick connect/disconnect fittings in conjunction with the design of the connector 220 allows the pump modules to be hot-swappable, meaning that they can be removed and/or inserted while the system is operating, without any need to shut down the system.

In operation of the connector 220, the diameter of the balancing channel 412 is optimized so that the connector 220 is self-balancing, meaning that it will still allow fluid to flow to one pump module if the other is removed; typically, the balancing channel will have a smaller diameter than the other tubes in the connector 220. In FIG. 4, the fluid follows the path of the arrows when both pump modules 238 and 240 are installed and functioning. The pressure from the pumps allows the fluid to bypass the fluid balancing channel 412 and flow directly to and from the pump modules.

Figure 5A:
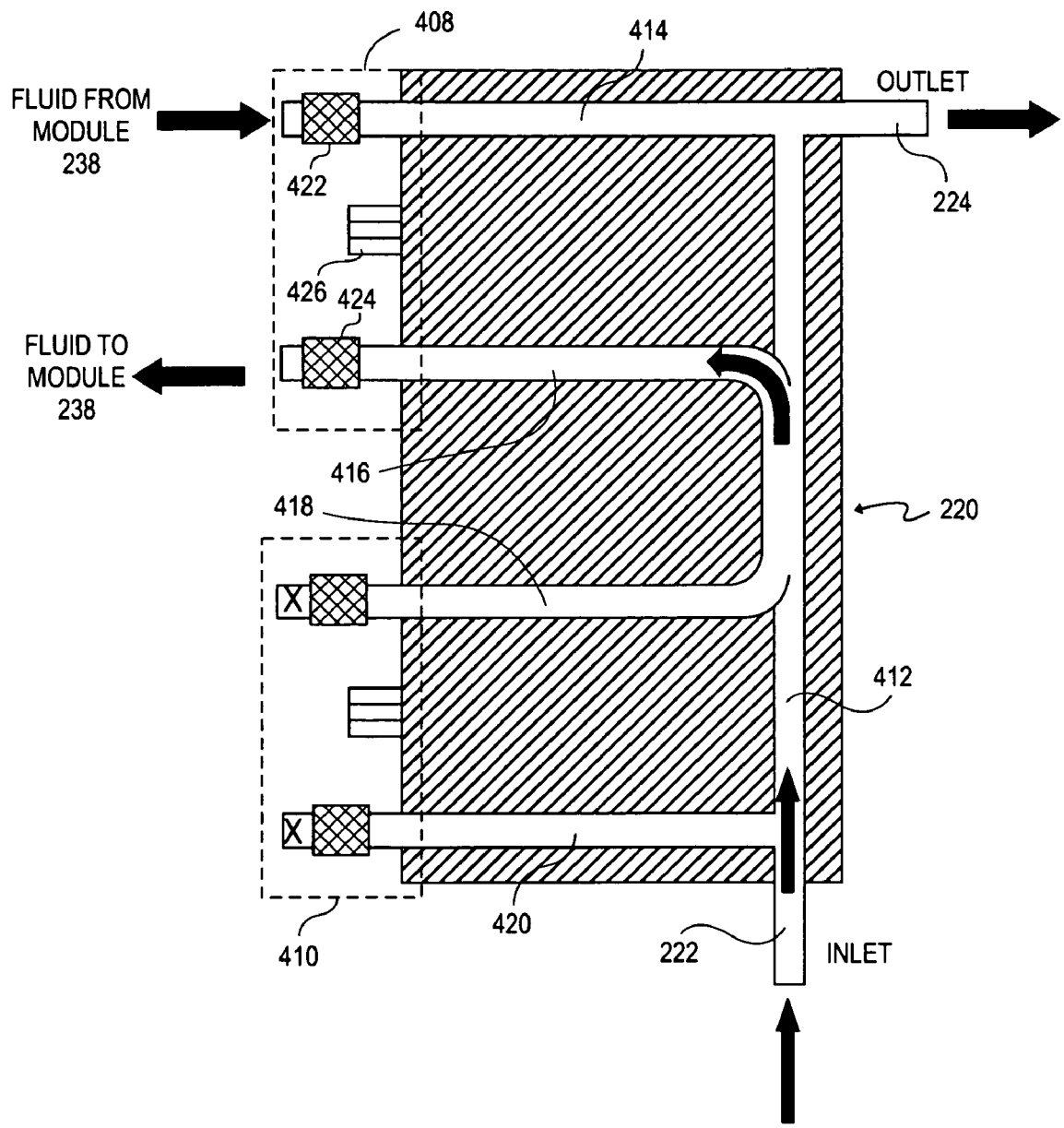
FIGS. 5A-5B are cross-sections of the embodiment of a fluid and electrical connector shown in FIG. 4 illustrating the operation of the connector.
Figure 5B:
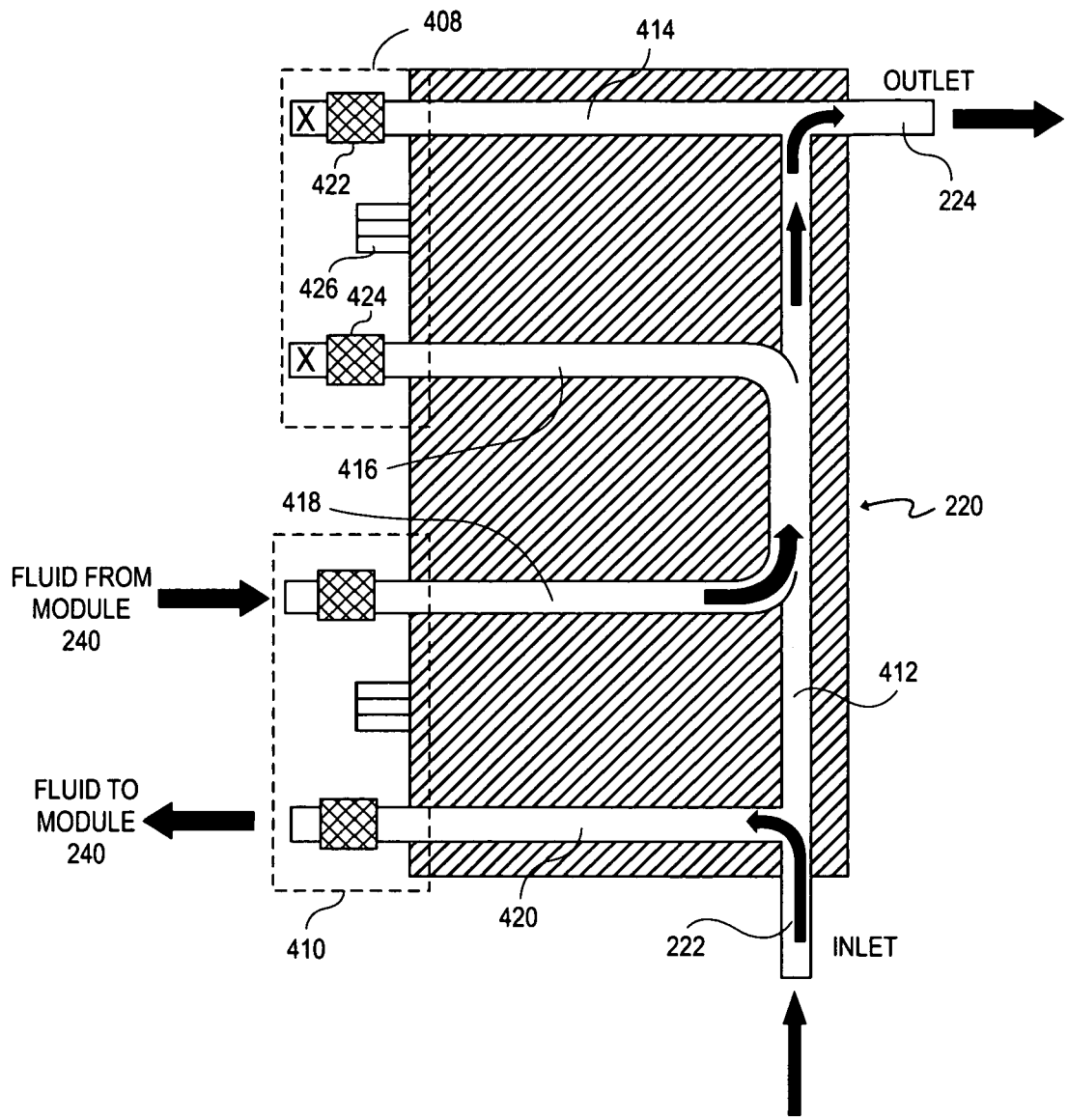

FIGS. 5A-5B illustrate the operation of leak-free connector 220 for cases where one of the pump modules is removed or is non-functional. FIG. 5A illustrates the case where the pump module 240 is removed or non-functional, and FIG. 5B illustrates the case where pump module 238 is removed or non-functional. The flow through the connector 220 in each case is shown by the arrows. The diameter of the balancing channel 412 is optimized to balance the pressure in the connector and ensure that the fluid flows through the channels that are connected to an operating pump module. This aspect of the design allows for the liquid cooling system to remain functional when one of the pump modules is not present or is non-functional.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An apparatus comprising:
    a cold plate having an inlet and an outlet, the cold plate being attachable to a heat source attached to a first substrate;
    a heat exchanger having an inlet and an outlet, wherein the outlet of the heat exchanger is coupled to the inlet of the cold plate;
    a leak-free connector attached to the first substrate and having a main inlet coupled to the outlet of the cold plate, a main outlet coupled to the inlet of the heat exchanger, and a pump interface including an inlet and an outlet; and
    a hot-swappable pump module assembled on a second substrate and removably coupled to the pump interface, the hot-swappable pump module including a reservoir having an inlet and an outlet and at least one pump coupled to the reservoir.

2. The apparatus of claim 1 wherein the pump interface is a first pump interface, and wherein the leak-free connector further includes a second pump interface including an inlet and an outlet.

3. The apparatus of claim 2 wherein the hot-swappable pump module is a first hot-swappable pump module, and further comprising a second hot-swappable pump module connected to the second pump interface.

4. The apparatus of claim 2 wherein the leak-free connector is self-balancing.

5. The apparatus of claim 1 wherein the inlet and the outlet of the pump interface include quick connect/disconnect fittings thereon.

6. The apparatus of claim 1 wherein the leak-free connector further includes an electrical connector.

7. The apparatus of claim 6 wherein the hot-swappable pump module further includes an electrical connector that can couple to the electrical connector of the leak-free connector.

8. The apparatus of claim 1 wherein the hot-swappable pump module comprises:
 a first pump whose inlet is connected to the outlet of the pump interface and whose outlet is connected the inlet of the reservoir; and
 a second pump whose inlet is connected to the outlet of the reservoir and whose outlet is connected to the inlet of the pump interface.

9. The apparatus of claim 8 wherein the reservoir includes a fluid level sensor.

10. The apparatus of claim 9 wherein the hot-swappable pump module includes a logic circuit coupled to the fluid level sensor and to a visual indicator of the fluid level.

11. An apparatus comprising:
 a cold plate having an inlet and an outlet, the cold plate being attachable to a heat source;
 a heat exchanger having an inlet and an outlet, wherein the outlet of the heat exchanger is coupled to the inlet of the cold plate;
 a leak-free connector having a main inlet, a main outlet, and a pump interface including an inlet and an outlet, wherein the main inlet is coupled to the outlet of the cold plate, the main outlet is coupled to the inlet of the heat exchanger; and
 a hot-swappable pump module coupled to the pump interface, the hot-swappable pump module including a reservoir and at least one pump coupled to the reservoir.

12. The apparatus of claim 11 wherein the pump interface is a first pump interface, and wherein the leak-free connector further includes a second pump interface including an inlet and an outlet.

13. The apparatus of claim 12 wherein the hot-swappable pump module is a first hot-swappable pump module, and further comprising a second hot-swappable pump module connected to the second pump interface.

14. The apparatus of claim 13 wherein the leak-free connector is self-balancing.

15. The apparatus of claim 11 wherein the inlet and the outlet of the pump interface include quick connect/disconnect fittings thereon.

16. The apparatus of claim 11 wherein the leak-free connector includes an electrical connector coupled to a power source.

17. The apparatus of claim 16 wherein the hot-swappable pump module includes an electrical connector that can couple to the electrical connector of the leak-free connector.

18. The apparatus of claim 11 wherein the reservoir has an inlet and an outlet and the hot-swappable pump module includes:
 a first pump whose inlet is connected to the outlet of the pump interface and whose outlet is connected the inlet of the reservoir; and
 a second pump whose inlet is connected to the outlet of the reservoir and whose outlet is connected to the inlet of the pump interface.

19. The apparatus of claim 18 wherein the reservoir includes a fluid level sensor.

20. The apparatus of claim 19 wherein the hot-swappable pump module includes a logic circuit coupled to the fluid level sensor and to a visual indicator of the fluid level.

21. A system comprising:
 a computer blade having thereon a processor and a synchronous dynamic random access memory (SDRAM);
 a cold plate having an inlet and an outlet, the cold plate being attached to the processor;
 a heat exchanger having an inlet and an outlet, wherein the heat exchanger is mounted to the blade and the outlet of the heat exchanger is coupled to the inlet of the cold plate; and
 a hot-swappable pump module coupled to the cold plate and to the heat exchanger and assembled on a mezzanine card, the hot-swappable pump module including a reservoir having an inlet and an outlet and at least one pump coupled to the reservoir.

22. The system of claim 21, further comprising a leak-free connector attached to the blade, the leak-free connector having a main inlet, a main outlet, and a pump interface including an inlet and an outlet, wherein the main inlet is coupled to the fluid outlet of the cold plate, the main outlet is coupled to the inlet of the heat exchanger, and the hot-swappable pump module is coupled to the pump interface.

23. The system of claim 22 wherein the inlet and the outlet of the pump interface include quick connect/disconnect fittings thereon.

24. The system of claim 21 wherein the hot-swappable pump module comprises:
 a first pump whose inlet is connected to the outlet of the pump interface and whose outlet is connected the inlet of the reservoir; and
 a second pump whose inlet is connected to the outlet of the reservoir and whose outlet is connected to the inlet of the pump interface.

25. The system of claim 24 wherein the reservoir includes a fluid level sensor.

26. The system of claim 25 wherein the mezzanine card includes a logic circuit coupled to the fluid level sensor and to a visual indicator of the fluid level.

27. A process comprising:
 cooling a heat source using a closed-loop cooling system comprising:
  a cold plate having an inlet and an outlet, the cold plate being attachable to the heat source, and the heat source being attached to a first substrate,
  a heat exchanger having an inlet and an outlet, wherein the outlet of the heat exchanger is coupled to the inlet of the cold plate,
  a leak-free connector attached to the first substrate and having a main inlet coupled to the outlet of the cold plate, a main outlet coupled to the inlet of the heat exchanger, and a pump interface including an inlet and an outlet, and
  a hot-swappable pump module assembled on a second substrate and removably coupled to the pump interface, the hot-swappable pump module including a reservoir having an inlet and an outlet and at least one pump coupled to the reservoir; and removing or installing the hot-swappable pump module while the cooling system is operating.

28. The process of claim 27 wherein the inlet and the outlet of the pump interface include quick connect/disconnect fittings thereon.

29. The process of claim 28 wherein the hot-swappable pump module comprises:

a first pump whose inlet is connected to the outlet of the pump interface and whose outlet is connected the inlet of the reservoir; and a second pump whose inlet is connected to the outlet of the reservoir and whose outlet is connected to the inlet of the pump interface.

* * * * *

UNITED STATES PATENT AND TRADEMARK OFFICE
CERTIFICATE OF CORRECTION

| | | |
|---|---|---|
| PATENT NO. | : 7,420,804 B2 | Page 1 of 1 |
| APPLICATION NO. | : 10/881884 | |
| DATED | : September 2, 2008 | |
| INVENTOR(S) | : Leija et al. | |

It is certified that error appears in the above-identified patent and that said Letters Patent is hereby corrected as shown below:

In column 4, at line 21, delete second occurrence of "disconnect".

Signed and Sealed this

Sixteenth Day of December, 2008

JON W. DUDAS
*Director of the United States Patent and Trademark Office*